(12) United States Patent
Vinokor et al.

(10) Patent No.: US 7,109,411 B2
(45) Date of Patent: Sep. 19, 2006

(54) ULTRA-LOW HEIGHT ELECTROMAGNETIC INTERFERENCE SHIELDING ENCLOSURE

(75) Inventors: Igor Vinokor, Skokie, IL (US); Vladislav Pirkhalo, Vernon Hills, IL (US); Anatoliy Shlahtichman, Buffalo Grove, IL (US); Eugene Smyk, Crystal Lake, IL (US); Zoilo Anthony Favela, Chicago, IL (US); Gerald English, Glen Ellyn, IL (US)

(73) Assignee: Laird Technologies, Inc., Deleware Water Gap, PA (US)

( * ) Notice: Subject to any disclaimer, the term of this patent is extended or adjusted under 35 U.S.C. 154(b) by 10 days.

(21) Appl. No.: 11/044,934

(22) Filed: Jan. 27, 2005

(65) Prior Publication Data

US 2005/0219831 A1 Oct. 6, 2005

Related U.S. Application Data

(60) Provisional application No. 60/540,180, filed on Jan. 29, 2004.

(51) Int. Cl.
*H05K 9/00* (2006.01)

(52) U.S. Cl. .............. 174/35 GC; 174/35 R; 174/35 MS; 174/66; 174/67; 174/50; 174/54; 361/816; 361/818

(58) Field of Classification Search ........... 174/35 GC, 174/35 R, 35 MS, 66, 67, 50, 54; 361/816, 361/818
See application file for complete search history.

(56) References Cited

U.S. PATENT DOCUMENTS

| | | | | |
|---|---|---|---|---|
| 5,032,689 A | * | 7/1991 | Halligan et al. | 174/35 R |
| 6,235,985 B1 | * | 5/2001 | Dai | 174/35 GC |
| 6,362,417 B1 | * | 3/2002 | Mitchell et al. | 174/35 GC |

* cited by examiner

Primary Examiner—Dean A. Reichard
Assistant Examiner—Anton Harris
(74) Attorney, Agent, or Firm—Harness, Dickey & Pierce, P.L.C.

(57) ABSTRACT

The electromagnetic shielding device includes a frame and a lid. The frame includes sidewalls and upstanding male detent elements with outwardly extending detent protrusions. The lid includes a generally planar top with peripheral lip portions. Slots are formed at the intersection of the lid and the peripheral lip portions so that upstanding male detent elements can extend therethrough and detent engage the frame to the lid. Variations of the detent engagement are shown in different embodiments. In particularly, a reduced height of the electromagnetic shielding device can be achieved.

3 Claims, 4 Drawing Sheets

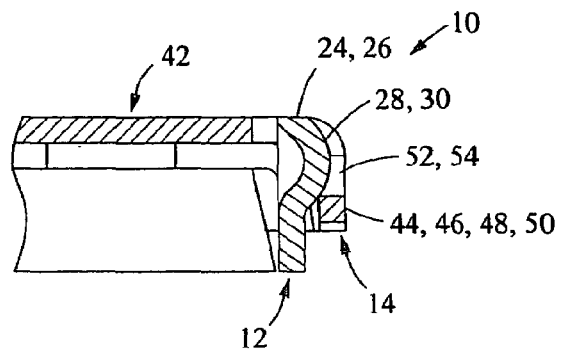
Fig. 6
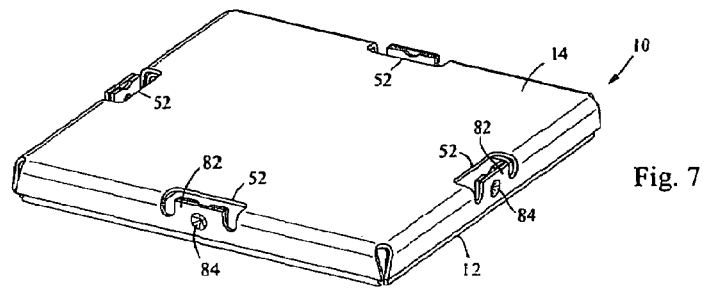
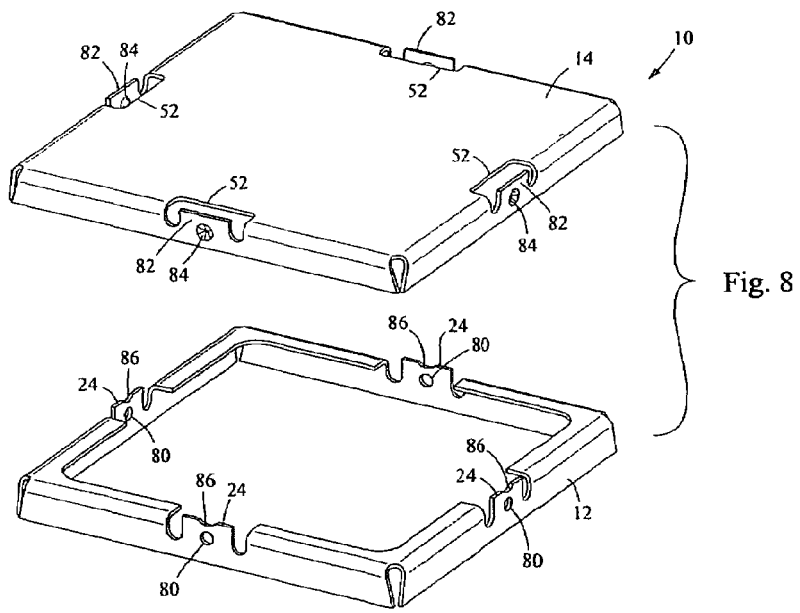
Fig. 7
Fig. 8
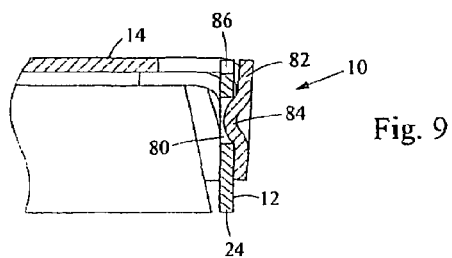
Fig. 9

ULTRA-LOW HEIGHT ELECTROMAGNETIC INTERFERENCE SHIELDING ENCLOSURE

This application claims priority of U.S. provisional application Ser. No. 60/540,180, filed on Jan. 29, 2004.

BACKGROUND OF THE INVENTION

1. Field of the Invention

The invention pertains to a two piece design, comprising a frame and cover, used as an enclosure for shielding electromagnetic radiation from exiting or entering the package on a printed circuit board. In particular, the present invention has a low height.

2. Description of the Prior Art

Some examples of prior art references in the electromagnetic shielding art are U.S. Pat. No. 6,501,016 entitled "Electromagnetic Shielding System for Printed Circuit Board" issued on Dec. 31, 2002 to Sosnowski; U.S. Pat. No. 5,530,202 entitled "Metallic RF or Thermal Shield for Automatic Vacuum Placement" issued on Jun. 25, 1996 to Dais et al.; U.S. Pat. No. 5,436,802 entitled "Method and Apparatus for Shielding an Electrical Circuit that is Disposed on a Substrate" issued on Jul. 25, 1995 to Trahan et al.; U.S. Pat. No. 5,422,433 entitled "Radio Frequency Isolation Shield Having Reclosable Opening" issued on Jun. 6, 1995 to Rivera et al.; U.S. Pat. No. 5,383,098 entitled "Shield Assembly" issued on Jan. 17, 1995 to Ma et al.; U.S. Pat. No. 5,354,951 entitled "Circuit Board Component Shielding Enclosure and Assembly" issued on Oct. 11, 1994 to Lange, Sr. et al.; and U.S. Pat. No. 4,754,101 entitled "Electromagnetic Shield for Printed Circuit Board" issued on Jun. 28, 1988 to Stickney et al.

OBJECTS AND SUMMARY OF THE INVENTION

It is therefore an object of the present invention to provide electromagnetic interference shielding for a component on a printed circuit board.

It is therefore a further object of the present invention to achieve the above objects with a shielding device which has a very low height from the printed circuit board, particularly when used with mobile handsets or similar applications where there is not enough room for devices with a greater height.

It is therefore a still further object of the present invention to achieve the above objects with a shielding device wherein reduced stress is placed on the device during assembly.

It is therefore a still further object of the present invention to achieve the above objects while keeping manufacturing and assembly costs low.

These and other objects are attained by providing a shielding device with a frame and a lid. The height of a shielding device of the present invention may be as low as 0.9 mm, and may typically be 1.4 mm. The frame includes four sidewalls which extend upwardly from the printed circuit board and include male detent protrusions. The top of the frame is generally open with a support extending thereacross. The lid has roughly the same footprint as the frame, with a planar top and a peripheral downwardly extending lip which engages the top periphery of the frame. Slots are formed in the intersection between the planar top and the downwardly extending lip. These slots of the lid are engaged by the male detent protrusions of the frame in the installed position. Variations in the detent engagement are disclosed.

BRIEF DESCRIPTION OF THE DRAWINGS

Further objects and advantages of the invention will become apparent from the following description and claims and from the accompanying drawings, wherein:

FIG. 6 is a cross-sectional view of the engagement between the frame and the lid of the first embodiment of the shielding device of the present invention.

FIG. 7 is a perspective view of the engaged lid and frame of the second embodiment of the shielding device of the present invention.

FIG. 8 is an exploded view of the lid and frame of the second embodiment of the shielding device of the present invention.

FIG. 9 is a cross-sectional view of the engagement between the lid and frame of the second embodiment of the shielding device of the present invention.

DETAILED DESCRIPTION OF THE PREFERRED EMBODIMENT

Figure 1A:
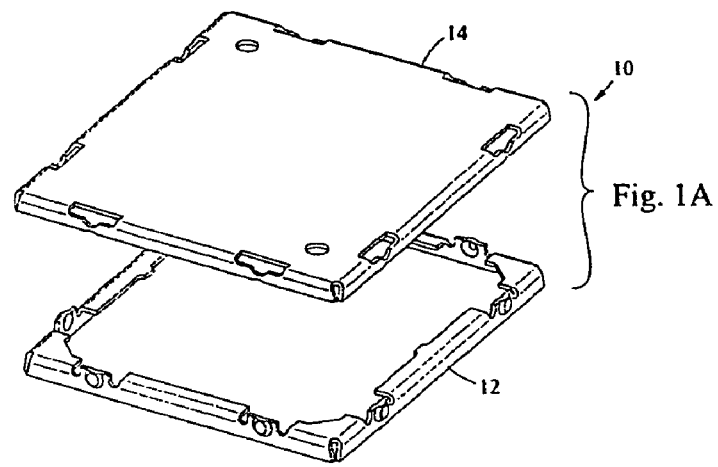
FIG. 1A is an exploded view of the lid and frame of the shielding device of the first embodiment of the shielding device of the present invention.
Figure 1B:
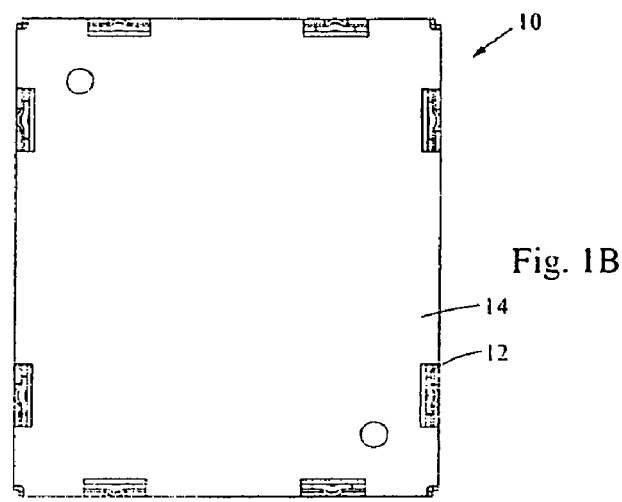
FIG. 1B is a top plan view of the engaged lid and frame of the first embodiment of the shielding device of the first embodiment of the present invention.
Figure 1C:
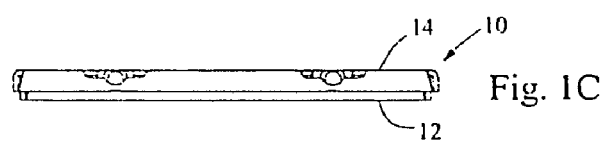
FIG. 1C is a side plan view of the engaged lid and frame of the first embodiment of the shielding device of the present invention.
Figure 1D:
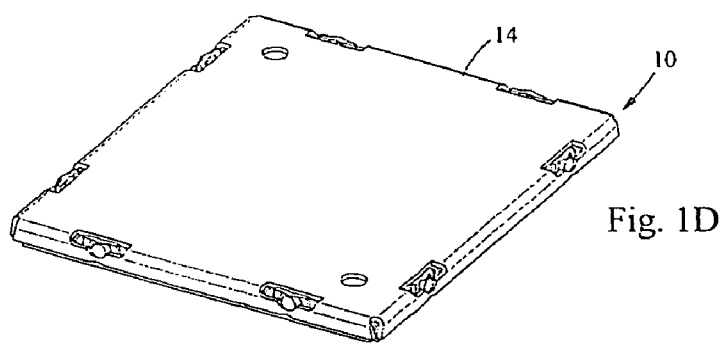
FIG. 1D is a perspective view of the engaged lid and frame of the first embodiment of the shielding device of the present invention.

Referring now to the drawings in detail, wherein like numerals refer to like elements throughout the several views, one sees FIGS. 1A–1D are various views of the first embodiment of shielding device 10 of the present invention, with frame 12 engaging lid 14. Frame 12 and lid 14 are typically formed from electrically conductive sheet metal.

Figure 2:
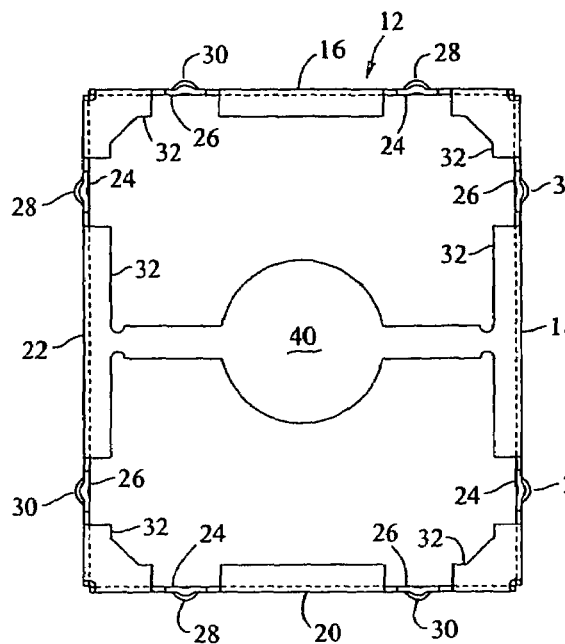
FIG. 2 is a top plan view of the frame of the first embodiment of the shielding device of the present invention.
Figure 3:
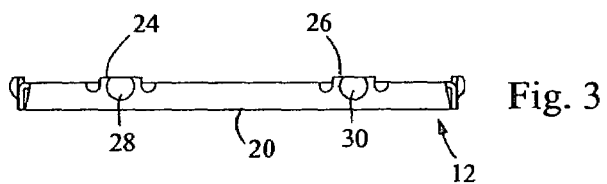
FIG. 3 is a plan view of the front of the frame of the first embodiment of the shielding device of the present invention.

Frame 12 is shown in more detail in FIGS. 2 and 3. Frame 12 includes four upright sidewalls 16, 18, 20, 22 in a generally rectangular or square configuration and is configured to attach on its lower side to a circuit board (not shown) so as to surround the electromagnetic device (not shown)

being shielded. Sidewalls 16, 18, 20, 22 may have a height to provide a total shield device height as low as 0.9 mm. However, the shielding device 10 may have a typical height of 1.4 mm. Each sidewall 16, 18, 20, 22 includes two upstanding male detent elements 24, 26 with respective outwardly extending protrusions 28, 30. Furthermore, inwardly extending lip 32 is formed about the periphery of the top of sidewalls 16, 18, 20, 22 except for the areas where the material is used to form the upstanding male detent elements 24, 26. Support beam 40 is formed across the open top of frame 12. Typically, all parts of frame 12 are integral and formed from a single piece of the electrically conductive sheet metal.

Figure 4:
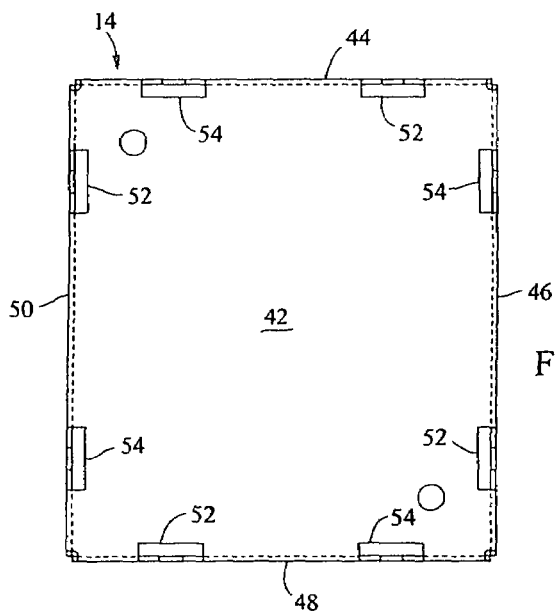
FIG. 4 is a top plan view of the lid of the first embodiment of the shielding device of the present invention.
Figure 5:
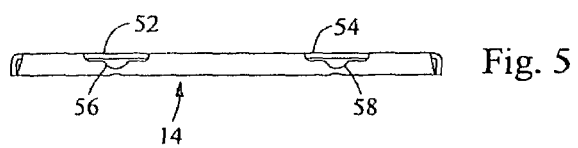
FIG. 5 is a plan view of the front of the lid of the first embodiment of the shielding device of the present invention.

Lid 14 is shown in more detail in FIGS. 4 and 5. Lid 14 includes a generally planar top 42 and downwardly extending lip portions 44, 46, 48, 50 which fit outwardly adjacently flush to sidewalls 16, 18, 20, 22, respectively, in the installed position. Slots 52, 54 are formed at the intersection of the planar top 42 and each downwardly extending lip portion 44, 46, 48, 50. As can be seen from FIGS. 4 and 5, slots 52, 54 extend into the lip portions 44, 46, 48, 50. Typically, slots 52, 54 would have a minimum width of 2.0 mm. As can be seen in FIG. 5, the portion of slots 52, 54 extending into lip portions 44, 46, 48, 40 has a central semi-circular cut-out portion 56, 58, respectively, for nesting with the outwardly extending protrusions 28, 30. Cut-outs 53, 55 are formed on the lower edge of lid 14, aligned with slots 52, 54, respectively. This helps to align lid 14 during installation.

As shown in FIG. 6, in the installed position wherein frame 12 and lid 14 are engaged, upstanding male detent elements 24, 26 extend into slots 52, 54 and outwardly extending protrusions 28, 30 extend laterally into slots 52, 54 to detent engage the frame 12 and lid 14 to each other.

The second embodiment of shielding device 10 is illustrated in FIGS. 7–9 wherein at least one upstanding male detent element 24 is on each sidewall of frame 12 and slot 52 corresponding to each upstanding male detent element 24 is on each sidewall of lid 14. Each upstanding male detent element 24 includes aperture 80. Each slot 52 has flange 82 adjacent thereto, including dimple 84. The detent configuration between the frame 12 and lid 14 is formed by flange 82 aligning outwardly adjacent from upstanding male element 24 and dimple 84 extending into aperture 80. Cut-outs 86 are on the top surface of upstanding male detent element 24 to aid in aligning dimples 84 during installation.

Figure 10:
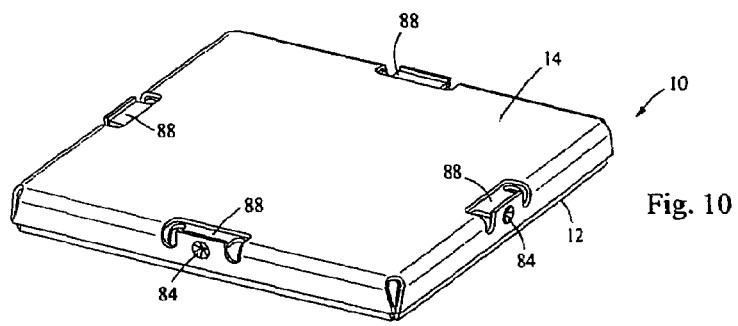
FIG. 10 is a perspective view of the engaged lid and frame of the third embodiment of the shielding device of the present invention.
Figure 11:
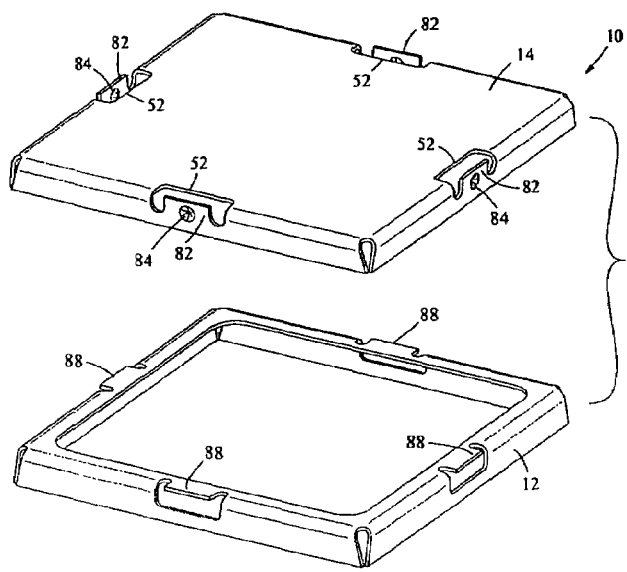
FIG. 11 is an exploded view of the lid and frame of the third embodiment of the shielding device of the present invention.
Figure 12:
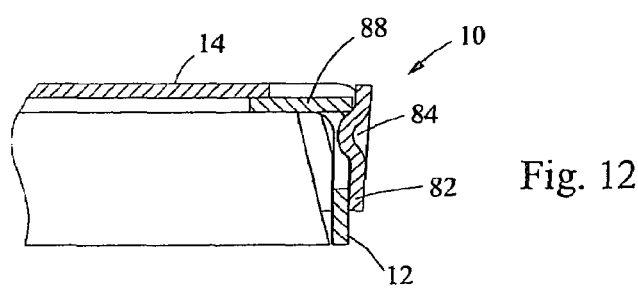
FIG. 12 is a cross-sectional view of the engagement between the lid and frame of the third embodiment of the shielding device of the present invention.
Figure 13:
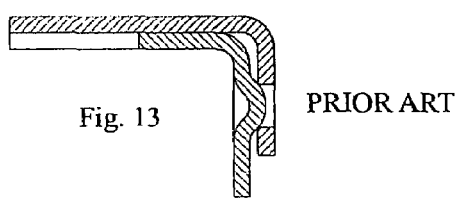
FIG. 13 is a cross-sectional view of the engagement between the frame and the lid of a first shielding device of the prior art.
Figure 14:
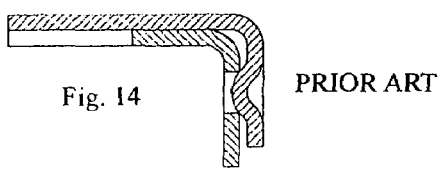
FIG. 14 is a cross-sectional view of the engagement between the frame and the lid of a second shielding device of the prior art.

The third embodiment of shielding device 10 is illustrated in FIGS. 10–12 wherein lid 14 is substantially identical to that of the second embodiment. In frame 12, however, upstanding male detent element 24 is replaced with horizontal flange 88. In the installed position, dimple 84 extends inwardly under horizontal flange 88, as shown in FIG. 12.

Thus the several aforementioned objects and advantages are most effectively attained. Although preferred embodiments of the invention have been disclosed and described in detail herein, it should be understood that this invention is in no sense limited thereby and its scope should be determined by that of the appended claims.

What is claimed is:

1. A shielding enclosure for an electromagnetic device, comprising:
   a frame including side walls and an open top, wherein said side walls include upwardly extending elements with lateral detent protrusions;
   a lid to cover said open top of said frame, said lid including slots to engage said upwardly extending elements;
   wherein said slots include semi-circular cut-out portions in which said lateral detent protrusions nest when said upwardly extending elements and said slots are engaged;
   wherein said lid includes a downwardly extending lip which surrounds said frame when said upwardly extending elements and said slots are engaged; and
   wherein said semi-circular cut-out portions are formed on said downwardly extending lip.

2. The shielding enclosure of claim 1 wherein after said upwardly extending elements have engaged said slots, said frame and lid have a combined height not exceeding 1.4 millimeter.

3. The shielding enclosure of claim 1 wherein after said upwardly extending elements have engaged said slots, said frame and lid have a combined height not exceeding 0.9 millimeter.

* * * * *